United States Patent
Graham

(10) Patent No.: US 6,636,173 B2
(45) Date of Patent: Oct. 21, 2003

(54) CALIBRATION SYSTEM AND METHOD FOR PHASED ARRAY ANTENNA USING NEAR-FIELD PROBE AND FOCUSED NULL

(75) Inventor: William John Graham, Bensalem, PA (US)

(73) Assignee: Lockheed Martin Corporation, Bethesda, MD (US)

( * ) Notice: Subject to any disclaimer, the term of this patent is extended or adjusted under 35 U.S.C. 154(b) by 67 days.

(21) Appl. No.: 10/027,393

(22) Filed: Dec. 20, 2001

(65) Prior Publication Data

US 2003/0117315 A1 Jun. 26, 2003

(51) Int. Cl.[7] ................................................. G01S 7/40
(52) U.S. Cl. ........................ 342/174; 343/776; 343/853; 342/360
(58) Field of Search ........................ 343/700 MS, 776, 343/853, 893; 342/165, 174, 360, 372, 376, 377

(56) References Cited

U.S. PATENT DOCUMENTS

| | | | | |
|---|---|---|---|---|
| 4,453,164 A | * | 6/1984 | Patton ........................ | 342/360 |
| 5,003,314 A | * | 3/1991 | Berkowitz et al. .......... | 342/372 |
| 5,559,519 A | * | 9/1996 | Fenner ........................ | 342/174 |
| 5,809,087 A | * | 9/1998 | Ashe et al. .................. | 375/340 |
| 6,084,545 A | | 7/2000 | Lier et al. .................... | 342/360 |
| 6,133,868 A | * | 10/2000 | Butler et al. ................. | 342/174 |
| 6,163,296 A | | 12/2000 | Lier et al. .................... | 342/417 |
| 6,384,781 B1 | * | 5/2002 | Kautz et al. ................. | 342/368 |
| 6,507,315 B2 | * | 1/2003 | Purdy et al. ................. | 342/374 |

* cited by examiner

*Primary Examiner*—Don Wong
*Assistant Examiner*—Shih-Chao Chen
(74) *Attorney, Agent, or Firm*—Scully, Scott, Murphy & Presser

(57) ABSTRACT

A system and method for calibrating a phase array antenna using a near-field probe and focused null and a signal coherent with the beam received or transmitted at the null location of the probe. In the transmit mode, a base-band phase comparator circuit is established by locating the first probe at the angular location of the null and the first probe measures the field at the null while an offset phase reference probe, or second probe, measures the field at one of the sum peaks of the difference lobes as the reference. In the transmit mode, the method uses the pattern characteristics of the difference pattern to allow direct measurement of the phase reference by the second probe that is located at one of the sum peaks of the difference pattern. In the receive mode, the signal source provides the reference and the second probe is not necessary.

12 Claims, 7 Drawing Sheets

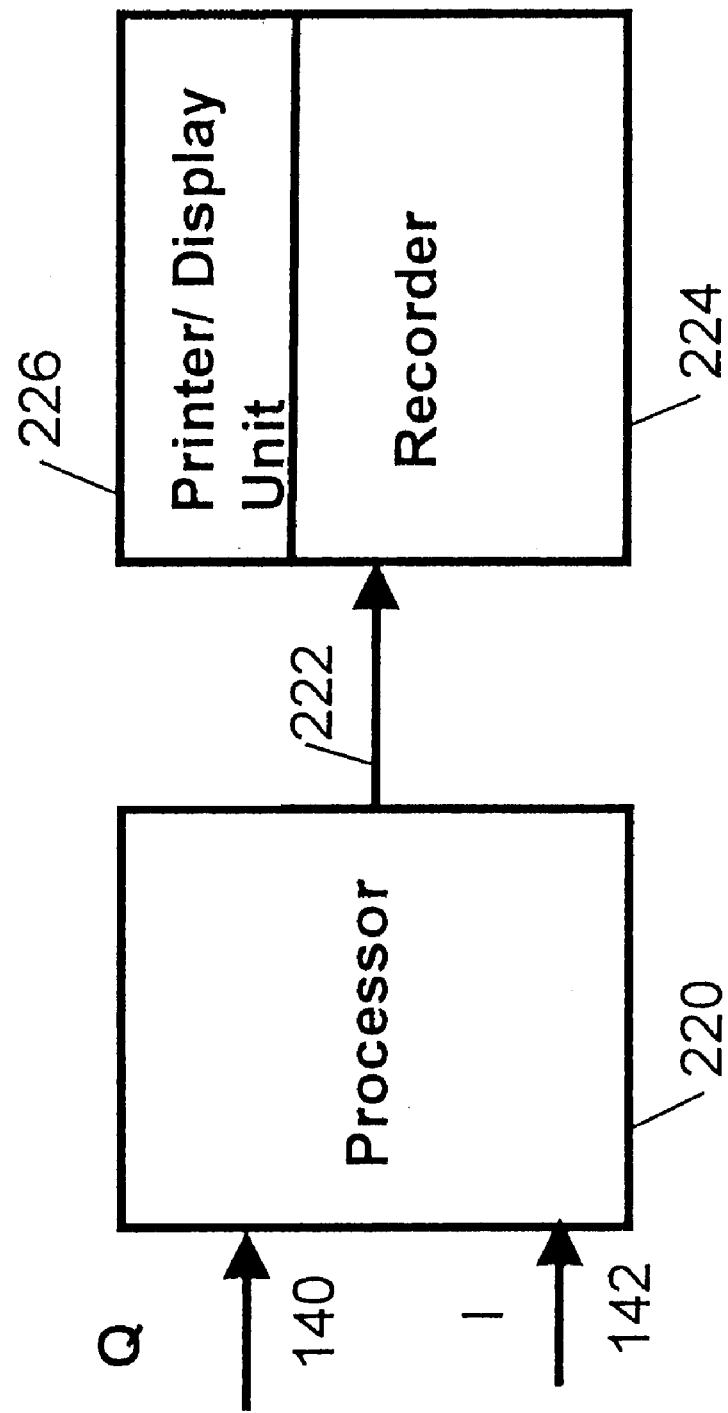

DIFFERENCE PATTERN PEAK

CALIBRATION SYSTEM AND METHOD FOR PHASED ARRAY ANTENNA USING NEAR-FIELD PROBE AND FOCUSED NULL

BACKGROUND OF THE INVENTION

The present invention relates to a method for remotely calibrating a phased array antenna and more specifically for active phased array antennas.

In a phased array antenna system, accurate measurement and correction in a calibration process of amplitude and phase errors is necessary for low side lobe array designs. Amplitude and phase errors may be caused by array deformation, active element pattern errors, phase shifter errors, or insertion phase and amplitude errors from electrical mismatches or tolerances in array components. The errors may also be independent among array elements, correlated over a sub-array of elements, and correlated over a row or column of elements.

Array deformation errors are actually element position errors that cause a phase error that depends upon the scan angle. This type of error can be corrected for all scan angles simultaneously.

Phase shifter, or phase quantization, errors are scan independent and contribute to side lobe level and beam pointing accuracy. For a 5 bit phase shifter, the phase shifter error has a root-mean-square (rms) value of 3.25°. This error is known a priori.

Insertion phase errors are random errors in the phase shifters or radiating antenna elements that may vary with time. In a phased array, random errors in the element path may also be incurred from active devices such as amplifiers, mixers, etc.

For satellite phased arrays, conventional calibration techniques are affected by propagation errors and satellite rotation. In all arrays, some techniques change the array environment for each measurement, and so create mutual coupling variations in the array environment.

Implementation of a phase measurement method on the active array requires a coherent phase reference signal. This signal must be coherent with the signal received at the null location of the measurement probe. The obvious method of providing this reference would be to split the source signal input to the array to provide a separate coherent reference signal. This method is not practical because of the required modification of the array hardware. It is desirable if possible to devise a method which is independent of the existing hardware, and can be simply implemented as a stand-alone measurement system, and which measures only a single antenna element path even though all antenna elements are active during the process of remotely calibrating a phased array antenna.

SUMMARY OF THE INVENTION

It is an object of this invention to provide an apparatus and method for remotely calibrating a phased array antenna, which yields the ability to measure only a single phase-shifter, even though all phase-shifters are active during the measurement.

In the present invention, for the transmit mode, a system is disclosed for calibrating at least one element of a transmit array antenna, the array antenna being coupled to a signal generating means for generating a coherent reference phase signal to at least one element, the signal emerging from the signal generating means transmitted as a beam from the array antenna, and the beam produces a null and a focused difference pattern having peaks on either side of the null. The array antenna forms a finite plane of the elements, the plane including a center point and extreme edges. The system for calibrating the elements of the array antenna comprises a null probe including a face, with the null probe being rigidly positioned normal to the plane of the array antenna and at a distance in the near-field of the array antenna, and the face of the null probe is rigidly positioned over the center point of the plane thereby forming an angle between the center point and a point on one of the extreme edges of the plane of the array antenna. The null probe is therein positioned over the center point of the array antenna corresponding to the null, so that the null probe, the center point, and the point on the extreme edge of the plane of the array antenna thereby form a plane normal to the finite plane of the elements.

A reference probe including a face is rigidly positioned parallel to, and at an offset position away from, the null probe in the plane formed by the null probe, the center point and the point on the extreme edge of the plane of the array antenna. The reference probe is also rigidly positioned at the distance in the near-field of the array antenna such that the face of the reference probe is positioned over one of the peaks of the focused difference pattern of the null. The null probe receives at the center point of the array antenna the null beam transmitted by the array antenna from the signal generating means to at least one element, and the beam received by the null probe is coupled as a signal to a first attenuator.

The first attenuator is coupled to a first two-way splitter, the first two-way splitter receiving the signal from the null probe through the first attenuator. The reference probe receives at the offset position from the null probe the beam transmitted by the array antenna from the signal generating means, and the beam received by the reference probe is coupled as a signal to a second attenuator. The second attenuator is coupled to a second two-way splitter, the second two-way splitter receiving the signal from the reference probe through the second attenuator.

A first mixer is provided which includes as input ports a radio-frequency port and a local oscillator port, and including as an output port an intermediate frequency port. A second mixer is provided which also includes as input ports a radio-frequency port and a local oscillator port, and including as an output port an intermediate frequency port.

The first two-way splitter splits the signal received from the null probe through the first attenuator into a first signal, substantially 0 degree phase-shifted, which is coupled to the radio-frequency port of the second mixer, and into a second signal, substantially 90 degree phase-shifted, which is coupled to the radio-frequency port of the first mixer. The second two-way splitter splits the signal received from the reference probe through the second attenuator into a first signal, substantially 0 degree phase-shifted, which is coupled to the local oscillator port of the second mixer, and into a second signal, substantially 0 degree phase-shifted, which is coupled to the local oscillator port of the first mixer.

The first mixer combines the substantially 90 degree phase-shifted signal of the first two-way splitter and the substantially 0 degree phase-shifted signal of the second two-way splitter to yield an output signal at the intermediate-frequency port of the first mixer. The output signal at the intermediate-frequency port of the first mixer is coupled to a first low-pass filter from which emerges a quadrature base-band component signal at substantially 0 degree frequency of the signal received from the null probe.

The second mixer combines the substantially 0 degree phase-shifted signal of the first two-way splitter and the substantially 0 degree phase-shifted signal of the second two-way splitter to yield an output signal at the intermediate-frequency port of the second mixer. The output signal at the intermediate-frequency port of the second mixer is coupled to a second low-pass filter from which emerges an in-phase base-band component signal at substantially 0 degree frequency of the signal received from said null probe.

A processor receives as an input signal the quadrature base-band component signal at substantially 0 degree frequency of the signal received from the null probe and also the in-phase base-band component signal at substantially 0 degree frequency of the signal also received from the null probe. The processor processes the quadrature base-band component signal and the in-phase base-band component signal into data representing calibration reference values of at least one element of the array antenna. A recorder records the data representing calibration reference values of at least one element of the array antenna.

Finally, a beam steering controller selects the phases on at least one element of the array antenna to form the difference null, and to vary the phase of at least one element of the array antenna.

For the receive mode, the present invention discloses a system for calibrating at least one element of a receive array antenna, with the array antenna forming a finite plane of the elements, the plane having a center point and extreme edges. The system in the receive mode comprises a signal generating means for generating a coherent reference phase signal, which is coupled to a signal source two-way splitter, the signal source two-way splitter splitting the coherent reference signal into a null signal carried to a horn probe. The horn probe includes a face, and the horn probe is rigidly positioned normal to the plane of the array antenna and at a distance in the near-field of said array antenna. The face of the horn probe is rigidly positioned over the center point of the plane thereby forming an angle between the center point and a point on one of the extreme edges of the plane of the array antenna. The horn probe is therein positioned over the center point of the array antenna corresponding to the null. The horn probe, the center point, and the point on the extreme edge of the plane of the array antenna thereby form a plane normal to the finite plane of the elements. The horn probe transmit at the center point of the array antenna the null beam received by the array antenna from the signal source to at least one element. The null beam received by the array antenna is coupled as a signal to a first attenuator.

The first attenuator is coupled to a first two-way splitter, the first two-way splitter receiving the signal from the array antenna through the first attenuator. The signal source two-way splitter splits the coherent reference phase signal into a reference signal which is carried as a signal to a second attenuator. The second attenuator is coupled to a second two-way splitter, the second two-way splitter receiving the signal from the signal source two-way splitter through the second attenuator.

From this point onward, the system in the receive mode is identical to the system in the transmit mode, starting with the previous description for the first and second mixers, and continuing with the first and second low pass filters, the quadrature base-band component signal, the in-phase base-band component signal, the processor, the recorder and the beam steering controller, and so will not be repeated here.

With regard to the method of the present invention, the method applies to calibrating at least one element in either a transmit array antenna or a receive array antenna. The method comprises the steps of: forming a difference null with errors for at least one element being calibrated in phase state n, thereby yielding the in-phase base-band component, $I_n$, and the quadrature base-band component, $Q_n$, of the difference null; estimating the difference null without the element being calibrated by averaging over N phase states, by solving for $$\epsilon = 1/N \Sigma (I_n + jQ_n) \tag{1};$$

estimating the field of the element in phase state n by subtracting the null without the element from the null with the element; calculating field, $E_n$, of the element in phase state n by solving:

$$E_n = (I_n + jQ_n) - \epsilon = X_n + jy_n \tag{2};$$

computing the absolute value of the estimate of the field of the element in phase state n, $|E_n|$, and the phase of the estimate of the field of the element in phase state n, $\arctan(y_n/x_n)$; and processing results of the calibration of the element being calibrated upon determining that all desired array elements have been measured.

For either the system in the transmit mode or in the receive mode, or the method which can be applied to either the transmit mode or the receive mode, the array antenna can be a phased array antenna or an active array antenna. Also, the data representing the calibration reference values of at least one element of the array can be illustrated using a printer and/or a display unit.

BRIEF DESCRIPTION OF THE DRAWINGS

FIG. 2 further illustrates the embodiment of the base-band phase comparators of the present invention of FIG. 1A and FIG. 1B.

DETAILED DESCRIPTION OF EXEMPLARY EMBODIMENTS

Figure 1A:
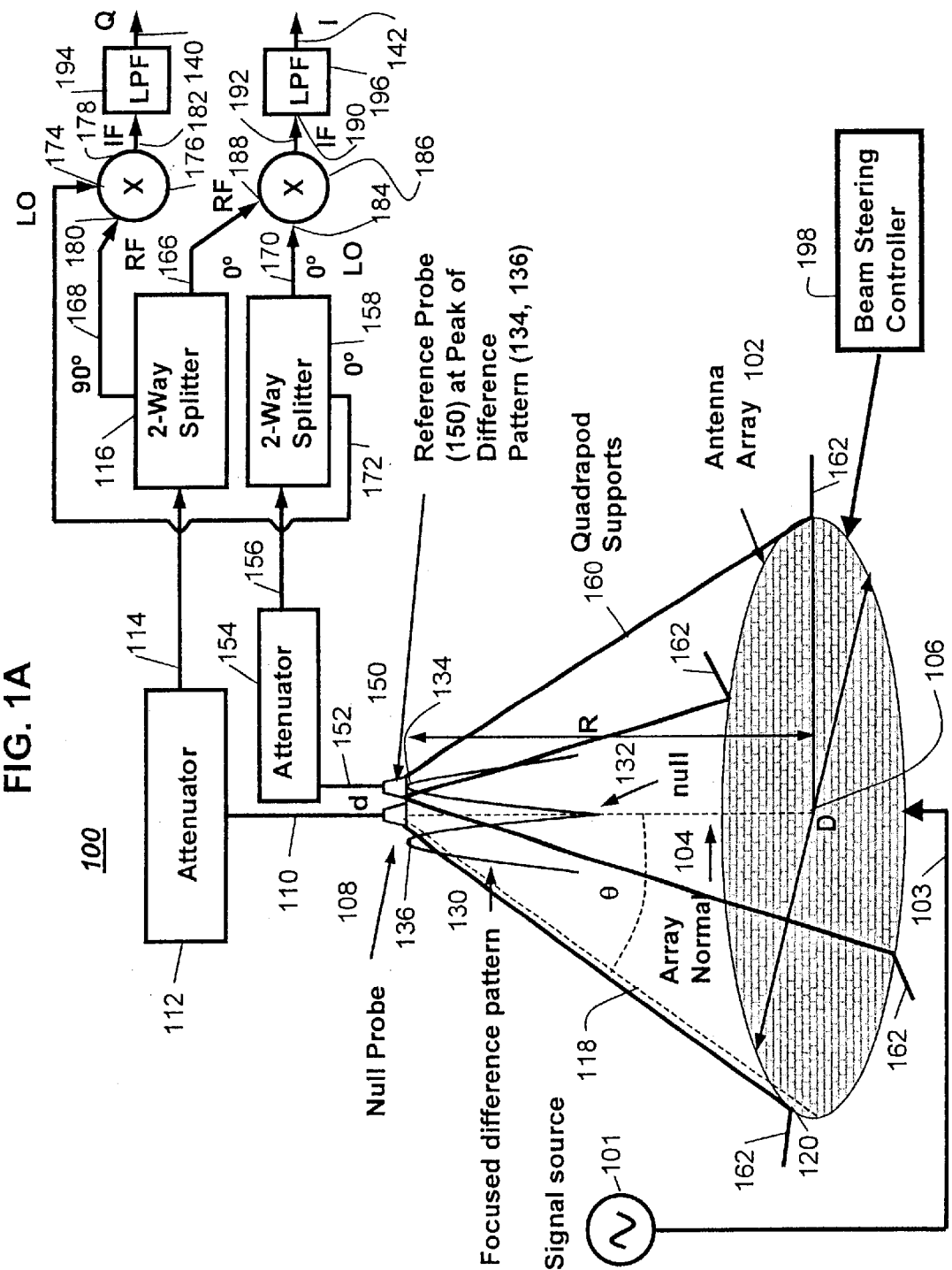
FIG. 1A illustrates an embodiment of the base-band phase comparator of the present invention for a phased array antenna in the transmit mode.

In FIG. 1A, there is illustrated an embodiment of the present invention as a system for calibrating, in the transmit mode, a phased array antenna, shown by way of example and not by way of limitation as a circular arrangement of diameter D, by means of a base-band phase comparator. A stationary antenna central null probe, or first probe, is located in the near field of the array. The array focuses a null on the first probe by using a focused difference pattern. The difference pattern of the array is formed by making the elements on one side of the array have an opposite polarity from those of the other half, and all elements have unity current amplitude. Variations in the null caused by individual element phase shift changes are used to determine the actual incurred phase shifts including phase errors. The null of the difference pattern is at 0, the center point of the phased array antenna. The difference peaks occur at a fraction of a degree on either side of the null. The level of the difference beams is about half that of the sum beam of the same array.

The method requires a coherent phase reference for the calibration measurements. The signal must be coherent with the beam received at the null location of the first probe. In the transmit mode, a base-band phase comparator circuit is established such that the first probe is located at the angular location of the null and the first probe measures the field at the null while an offset phase reference probe, or second probe, measures the field at one of the sum peaks of the difference lobes as the reference. In the receive mode the reference is provided by the signal source and the second probe is not necessary. To determine the proper location for the second probe, the focused difference pattern must be computed. For a focused radius R, where typically R=2D, having an angle θ from the normal to the edge of the array. R is defined as radial distance. For the focused radius R, the angle between the array normal and the edge of the array is 14 degrees. The focused pattern is approximately the same as the far-field pattern as a function of angle, and its angular variation can be computed easily. Since the focused pattern is the same in angle as the computed far-field pattern, the angular distance can be converted into lateral offset, x, from the array axis.

In the transmit mode, the method uses the pattern characteristics of the difference pattern to allow direct measurement of the phase reference by the second probe that is located at one of the sum peaks of the difference pattern. Since the peak is at half the level of the peak of a sum beam, the amplitude for a large array of a few thousand elements does not change measurably with the variation of a single element phase shifter. The field value at this peak therefore provides a coherent phase reference for measurement of the actual element phase. Therefore, a coherent reference signal is provided by the base-band phase comparator circuit without modification of or addition to the phased array antenna hardware.

In FIG. 1A, for simplicity, a one-dimensional case is illustrated for the base-band phase comparator 100. Signal source 101 provides a coherent phase reference signal 103 to phased array antenna 102. Phased array antenna 102 is shown, again by way of example and not by way of limitation, as a circular arrangement of connected diameter D. The array normal 104 extends from the center point 106 of the phased array antenna 102 to simple probe element 108. Simple probe element 108 is centered on the array normal and is at a distance R large enough to be at a measurable level on all of the element patterns. Probe 108, through its output signal 110, is connected to its own dedicated attenuator 112. The output signal 114 of attenuator 112 is connected to a 2-way splitter 116. A plane is formed by the array normal 104 and a line 118 drawn from the simple probe element 108 to a point 120 at the edge of the phased array antenna 102. The line 118 is inclined at an angle theta (θ) to the array normal 104.

A composite beam difference pattern 130 of the phased array antenna 102 is formed by making the elements on one side of the array have an opposite polarity from those of the other half, and all elements have unity current amplitude. The null is focused by phase shifting for the distance to the probe. In effect, a null is formed on the probe since the resulting array pattern is then a focused null on the probe position. Alternating the polarity is performed once. Alternating the polarity is frequency independent, but phase shifting is frequency dependent. With respect to the plane formed by the first probe and the second probe, the different halves are oriented perpendicular to this plane, since that is where the null is formed.

The null point 132 of the beam difference pattern 130 is at 0, the center point 106 of the phased array antenna 102. Difference peaks 134 and 136 occur at a fraction of a degree on either side of the null point 132. The level of the difference beams is about half that of the sum beam of the same array.

A second probe element 150 is positioned over beam difference peak 134. The second probe 150 provides an output signal 152 which represents the measurement of the difference peak 134 of the composite beam difference pattern 130, with difference peak 134 acting as the reference. Probe 150 is connected to its own dedicated attenuator 154 whose output signal 156 is input to a second 2-way splitter 158. Probe 108 is supported by support struts 160 that are attached to antenna mount 162. Similarly, second probe 150 is also supported by support struts 160 that are attached to antenna mounts 162.

Signal 114 which originates from first probe 108 centered over the null point 132 is divided by 2-way splitter 116 into two parts 166 and 168 of equal amplitude, each at one-half of the original signal power, but phase shifted substantially 90° from each other. Signal 166 remains at substantially 0° phase shift with respect to the source signal 114 while signal 168 is phase shifted substantially 90° with respect to the source signal 114. Similarly, signal 156 which originates from second probe 150 centered over peak 134 of the composite difference pattern 130 is divided by 2-way splitter 158 into two identical parts 170 and 172, each at one-half of the original signal power, and each remaining at substantially 0° phase shift with respect to the source signal 156.

The substantially 90° phase shifted signal 168, which is connected to the radio-frequency (RF) port 174 of mixer 176, provides the null measurement signal. The local oscillator(LO) port 180 of mixer 176 simultaneously receives substantially 0° phase shifted signal 172 from 2-way splitter 158, providing a reference signal at the same frequency as the null measurement frequency. The intermediate frequency(IF) port 178 of mixer 176 then yields its output signal 182 to low pass filter (LPF) 194 from which it emerges as the quadrature (Q) base-band component 140 at zero frequency of the null measurement signal.

Similarly, the substantially 0° phase shifted signal 170 is connected to the LO port 184 of mixer 186 providing a reference signal at the same frequency as the null measurement signal. The RF port 188 of mixer 186 simultaneously receives substantially 0° phase shifted signal 166 from 2-way splitter 116 providing the null measurement signal. The IF port 190 of mixer 186 then yields its output signal 192 to LPF 196 from which it emerges as the in-phase (I) base-band component 142 at zero frequency of the null measurement signal.

The beam steering controller 198 selects the phases on the array elements to form the difference null, and to vary the phase of the element under test.

Figure 1B:
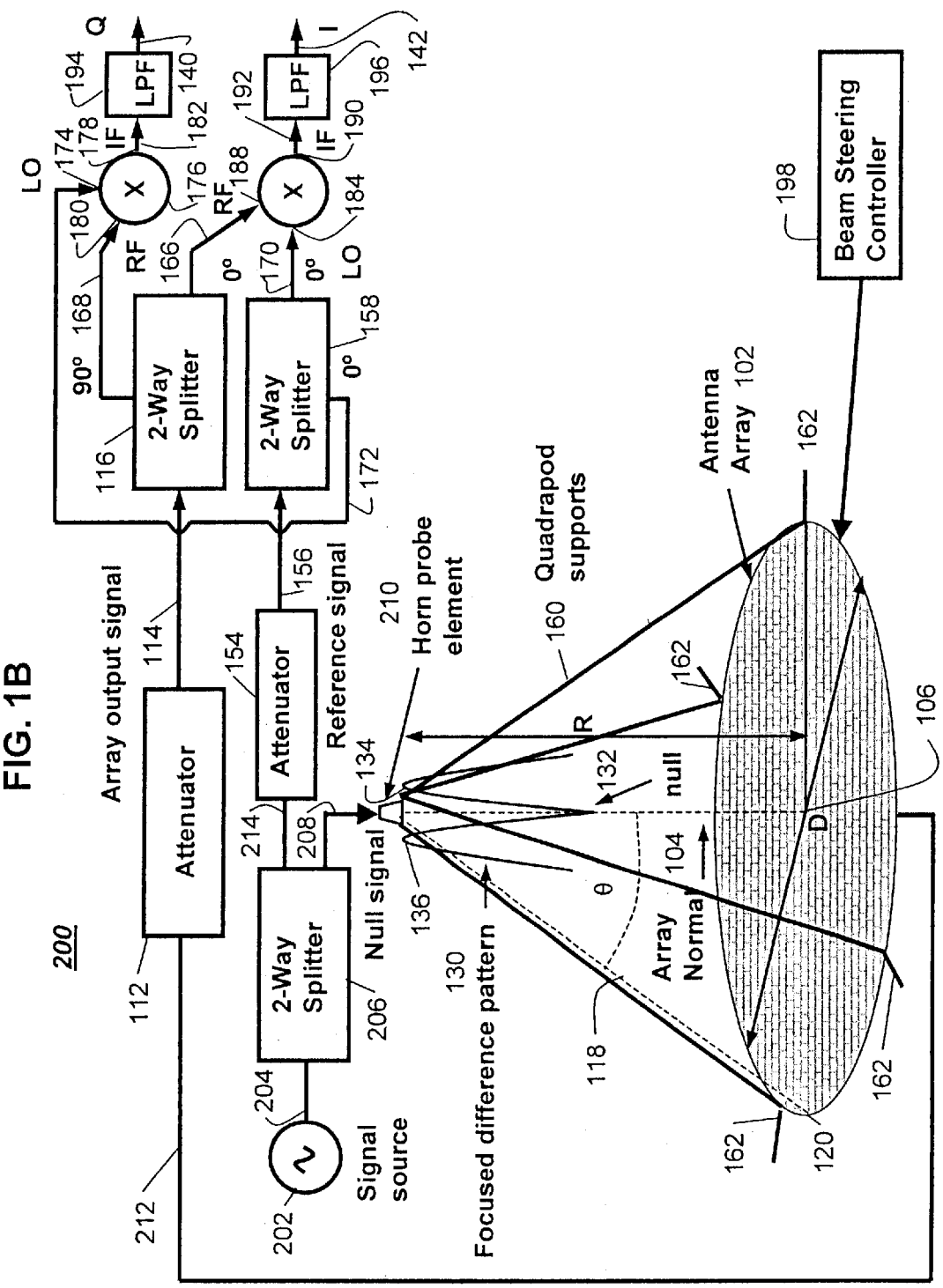
FIG. 1B illustrates an embodiment of the base-band phase comparator of the present invention for a phased array antenna in the receive mode.

FIG. 1B illustrates, for simplicity, a one-dimensional case in the receive mode for base-band phase comparator 200. In the receive mode, signal source 202 provides a coherent reference phase signal 204 to a 2-way splitter 206 which splits the signal 204 into two components. One component 208, the null signal, is carried through horn probe element 210 for transmission as a beam to array antenna 102. The null beam is received by the phased array antenna 102 and is carried as signal 212 to attenuator 112. The other component of signal 204 is carried as signal 214 to attenuator 154. In all other respects, the apparatus components are identical to those for the transmit mode illustrated in FIG. 1A, and so the components are numbered in FIG. 1B with the identical item numbers as in FIG. 1A, as appropriate.

Again, phased array antenna 102 is shown by way of example and not by way of limitation as a circular arrangement of connected diameter D. The array normal 104 extends from the horn probe element 210 to the center point 106 of the phased array antenna 102. The single simple probe element 210 is centered on the array normal and is at a distance R large enough to be at a measurable level on all of the element patterns. The output of signal 114 of attenuator 112 is connected to a 2-way splitter 116. A plane is formed by the array normal 104 and a line 118 drawn from the simple probe element 210 to a point 120 at the edge of the phased array antenna 102. The line 118 is inclined at an angle theta (θ) to the array normal 104.

The processing of the signals in the receive mode is identical to the processing of the signals in the transmit mode. In the receive mode, again referring to FIG. 1B, signal 114 which originates from the receive signal 212 at the center 106 of the array antenna 102 centered under the null point 132 is divided by 2-way splitter 116 into two parts 166 and 168 of equal amplitude, each at one-half of the original signal power, but phase shifted substantially 90° from each other. Signal 166 remains at substantially 0° phase shift with respect to the source signal 114 while signal 168 is phase shifted substantially 90° with respect to the source signal 114. Signal 214 is attenuated by attenuator 154 and emerges as signal 156, which in turn is divided by 2-way splitter 158 into two identical parts 170 and 172, each at one-half of the original signal power, and each remaining at substantially 0° phase shift with respect to the source signal 156.

Again, the substantially 90° phase shifted signal 168, which is connected to the RF port 174 of mixer 176, provides the null measurement signal. The LO port 180 of mixer 176 simultaneously receives substantially 0° phase shifted signal 172 from 2-way splitter 158, providing a reference signal at the same frequency as the null measurement frequency. The IF port 178 of mixer 176 then yields its output signal 182 to LP filter 194 from which it emerges as the quadrature (Q) base-band component 140 at zero frequency of the null measurement signal.

Similarly, the substantially 0° phase shifted signal 170 is connected to the LO port 184 of mixer 186 providing a reference signal at the same frequency as the null measurement signal. The RF port 188 of mixer 186 simultaneously receives substantially 0° phase shifted signal 166 from 2-way splitter 116 providing the null measurement signal. The IF port 190 of mixer 186 then yields its output signal 192 to LP filter 196 from which it emerges as the in-phase (I) base-band component 142 at zero frequency of the null measurement signal. Again, the beam steering controller 198 selects the phases on the array elements to form the difference null, and to vary the phase of the element under test.

Those skilled in the art will recognize that the specific accuracy requirements of the amplitude attenuation, phase shifting and final calibration settings for either the transmit case or the receive case are only as rigorous as what is required by the particular application in which the array antenna system is deployed.

Figure 3:
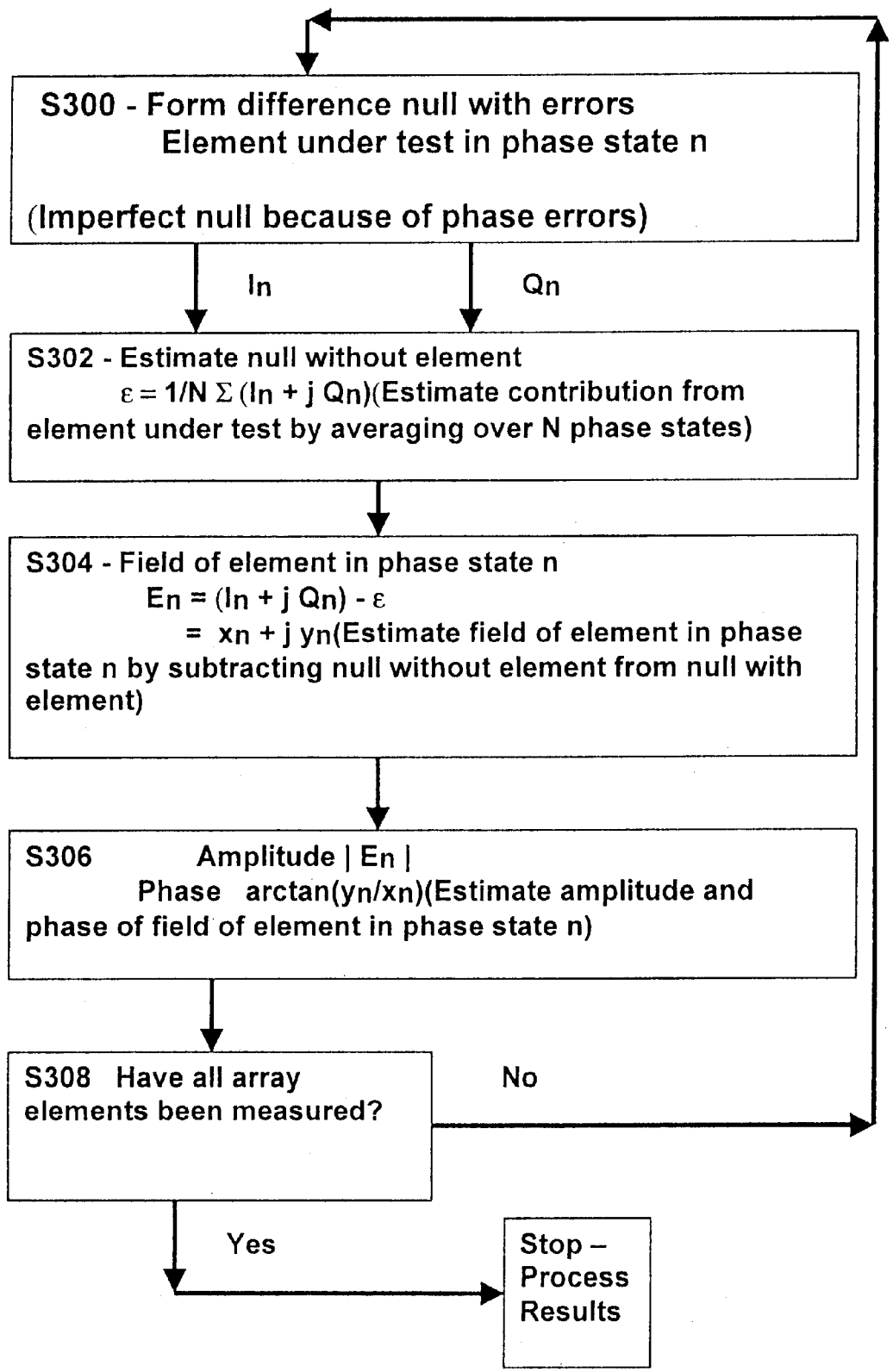
FIG. 3 illustrates a block diagram of the data processing required by the present invention.

FIG. 2 illustrates that the Q base-band component 140 at zero frequency of the null measurement signal and the I base-band component 142 at zero frequency of the null measurement signal are commonly directed to a data processor 220 which is coupled by signal 222 to a recorder 224 which records the results of the data processing. The results can optionally be displayed on or printed at optional printer/display unit 226. FIG. 3 illustrates the method of processing the data for either the transmit or receive modes. In step S300, an element of the array antenna is under test in phase state n out of a possible $N=2^n$ states. Due to phase errors, step S300 directs forming of a difference null with errors, yielding the in-phase base-band component, $I_n$, and the quadrature base-band component, $Q_n$. Step S302 directs estimating the null without the element under test by averaging over N phase states, by solving for $$\epsilon = 1/N \Sigma (I_n + j Q_n) \qquad (1)$$

Step S304 directs estimating the field of the element in phase state n by subtracting the null without the element from the null with the element. The field, $E_n$, of the element in phase state n is given by the following equation:

$$E_n = (I_n + j Q_n) - \epsilon = X_n + j y_n \qquad (2)$$

Finally, step S306 directs computing the absolute value of the estimate of the field of the element in phase state n, $|E_n|$, and the phase of the estimate of the field of the element in phase state n, $\arctan(Y_n/X_n)$.

Step S308 is a decision step in which it is determined whether all of the desired array elements have been measured. If yes, then step S310 is implemented whereby the test is stopped and the results are processed. If no, then step S300 is again implemented until all of the desired remaining elements of the array antenna 102 have been measured. Typically, all of the elements in the array are measured.

EXAMPLE

As an example of the results obtained by the present invention, the transmit figuration of FIG. 1A is assumed and a simple probe element centered on the array axis and at a distance large enough to be at a measurable level on all the element patterns. A typical distance is about R=2D where D is the array diameter, having an angle from the axis to the edge of the array of 14°. A second reference probe with a lateral offset is placed at the peak of the formed difference beam. In order to determine the placement of this reference probe, the focused difference pattern of the array must be computed. For the focused distance of R=2D the focused pattern will be approximately the same as the far-field pattern, and its angular variation can easily be computed. For simplicity, a one-dimensional difference pattern is considered. corresponding to the pattern in a principal plane of the two-dimensional array. The array is divided into sub-arrays of width d=2.5 λ which corresponds to the proposed active array sub-array width.

Definition of parameters:

$$k = \frac{2 \cdot \pi}{\lambda}$$

is the wave number; and d=2.5·λ is the sub-array width.

The number of sub-array "elements" in the proposed active array configuration is 40×40 so the linear array equivalent has N=20 for a total number of elements which is 2*N.

θ is the angle from the array axis.

The difference pattern of the array is formed by making the elements on one side of the array have an opposite polarity from those of the other half, and all elements have unity current amplitude. The resulting array factor of the composite pattern is then $$D(\theta) = \frac{1}{N} \cdot \left| \frac{\sin\left(k \cdot N \cdot d \cdot \frac{\sin(\theta)}{2}\right)^2}{\sin\left(k \cdot d \cdot \frac{\sin(\theta)}{2}\right)} \right|$$

array factor difference pattern.

Assuming uniform current amplitude over a sub-array, the sub-array factor is given by $$s(\theta) = \left| \frac{\sin\left(k \cdot d \cdot \frac{\sin(\theta)}{2}\right)}{\left(k \cdot d \cdot \frac{\sin(\theta)}{2}\right)} \right|$$

Figure 4:
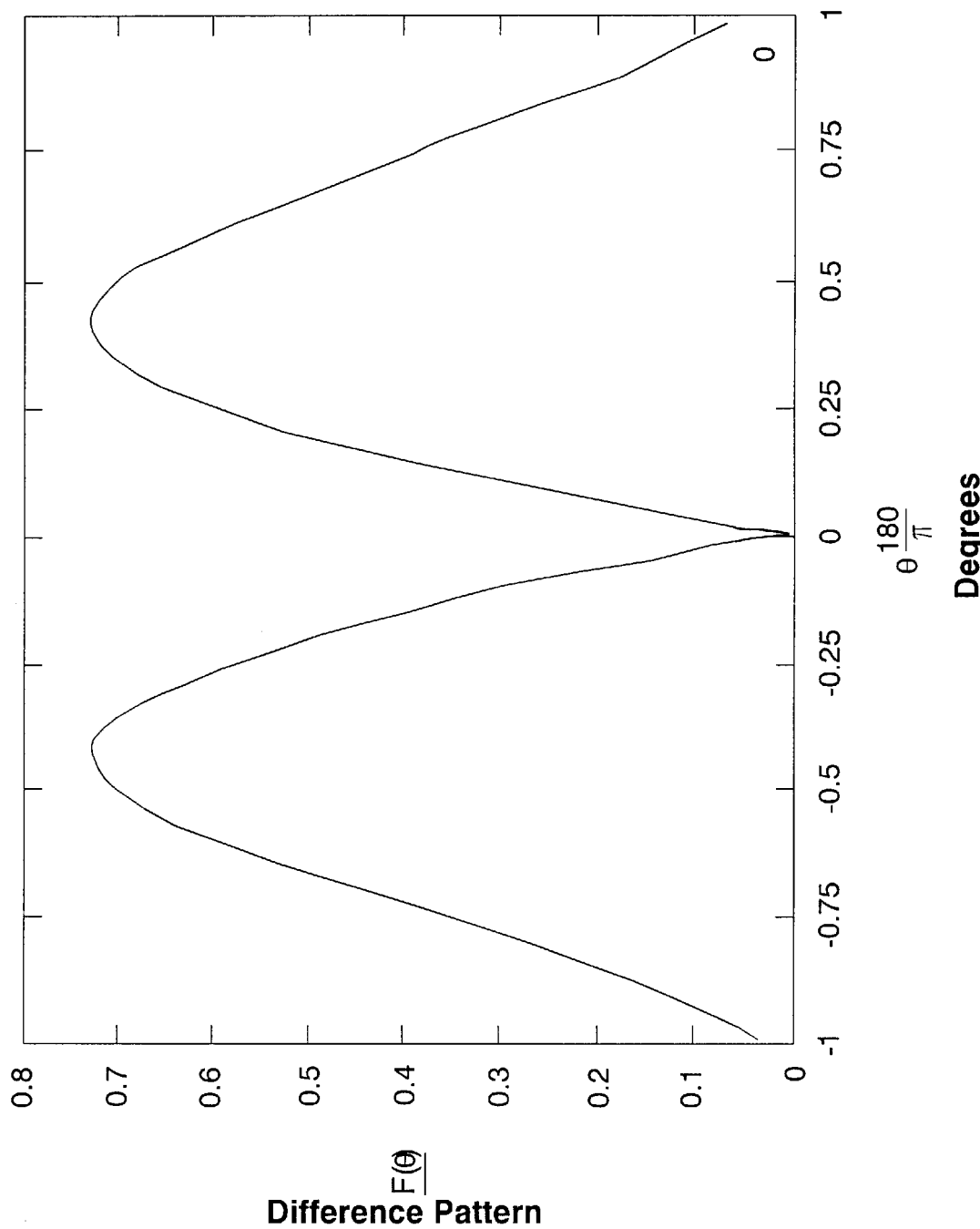
FIG. 4 is a graphical plot of example results for the array factor difference pattern of the present invention in the transmit mode.

The composite difference pattern of the array is then given by $F(\theta)=|D(\theta)\cdot s(\theta)|$, which is plotted in FIG. 4 as a function of θ.

The composite difference pattern as a function of x is then computed as $$D(x) = \frac{1}{N} \cdot \left| \frac{\sin\left(k \cdot N \cdot \frac{d}{2} \cdot \frac{x}{\sqrt{x^2 - R^2}}\right)^2}{\sin\left(k \cdot \frac{d}{2} \cdot \frac{x}{\sqrt{x^2 - R^2}}\right)} \right|$$

array factor difference pattern;

$$s(x) = \left| \frac{\sin\left(k \cdot \frac{d}{2} \cdot \frac{x}{\sqrt{x^2 - R^2}}\right)}{\left(k \cdot \frac{d}{2} \cdot \frac{x}{\sqrt{x^2 - R^2}}\right)} \right|$$

sub-array pattern factor;

$F(x)=|D(x\cdot s(x)|$ composite field amplitude at R vs. horizontal displacement x.

p(x)=reference probe position at x=2.3 cm (0.90 in).

Figure 5:
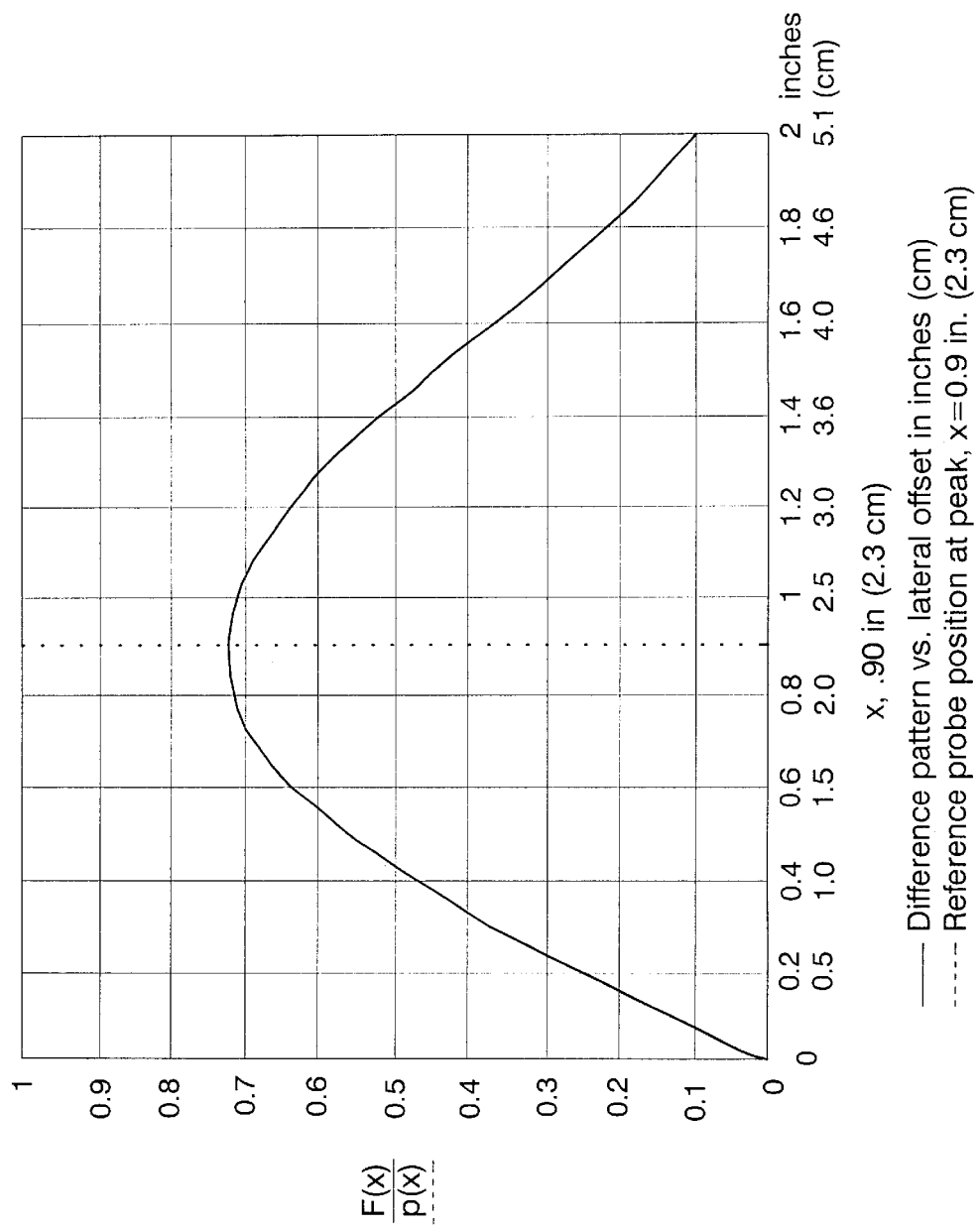
FIG. 5 is a graphical plot of example results for the composite field amplitude versus the horizontal displacement x in the transmit mode.

FIG. 5 shows this field amplitude variation from the axis toward one of the difference beams. The position of the reference probe is also shown at the peak of the difference beam which occurs at a distance of x=2.3 cm (0.9 in). Since the wavelength is 1.5 cm (0.6 in.), simple probes of about half-wavelength dimension of 0.75 cm (0.3 in.) would easily fit the required spacing, allowing an end-to-end separation between the null probe and the reference probe of about 1.5 cm (0.6 in).

Figure 6:
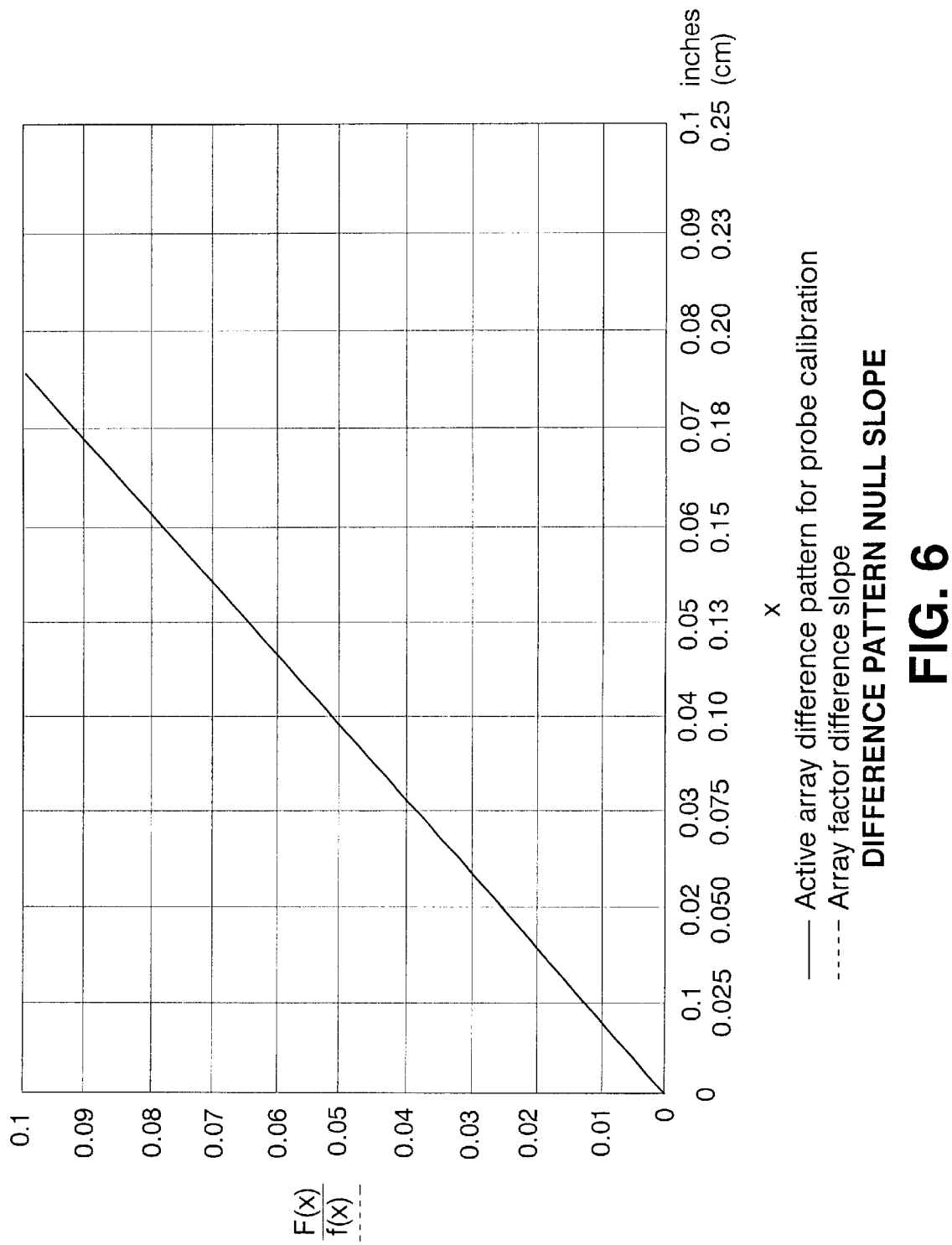
FIG. 6 is a graphical plot of example results for an enlargement of the null region for determination of the sensitivity of the null probe to position errors in the transmit mode.

FIG. 6 shows an enlargement of the null region for determination of the sensitivity of the null probe to position errors. The difference slope in terms of lateral displacement is m=1.636 in the vicinity of the null which can be used for error prediction and tolerance requirements. For example, a probe position accuracy of 0.005 cm (0.002 in.) would limit the null error to an amplitude of 0.0075 cm (0.003 in.).

In summary, the proposed method is the use of a near-field probe element centered on the array axis at a distance of about twice the width of the array. The distance depends upon the angular width of the individual element pattern. The probe need only be the size of a conventional array element, i.e., one-half to one wavelength in width, so that blockage is negligible. By phase shifting the individual elements properly, a null is focused on the near-field probe location.

The null is focused by creating a focused difference pattern. The difference pattern is created by opposing the polarity of adjacent halves of the array and then phase shifting for the distance to the probe. In effect, a null is formed on the probe since the resulting array pattern is then a focused null on the probe position.

By observing the change in the null as a single element phase is varied, a highly sensitive measurement of the variation of the phase of the element is possible. Since all the elements have amplitude and phase errors, the null will not have an initial field value of exactly zero but will be somewhat filled. To measure the field due to a single element alone, the value of the null without this element is estimated and then subtracted from the original null measurement. When the element phase is now varied, the field measured at the probe ideally is a good approximation of that of the element under test.

Those skilled in the art will recognize that the only additional hardware required is a single element probe mounted normal to the array at a distance of about twice the array width, and the transmit/receive hardware for the probe measurement. Since the method can be performed also on a satellite, it is independent of propagation errors, and the signal-to-noise ratio is greatly enhanced over other ground-based calibration techniques because of the proximity of the measurement probe. The method is highly accurate and computationally fast and simple to implement. Since the amplitudes and phases of all of the other elements are the same for each element under test, the test is performed under exactly the same conditions for each element. Therefore, the measurement is independent of mutual coupling variations.

The phase quantization error is known a priori and is not measured by the present invention. When performed on a satellite, array pointing errors caused by rotation of the satellite are also not measured by the present invention since all measurements are done within the array-probe coordinate system.

The method provides for remotely calibrating an phased array antenna that: 1) can compensate for all phase and amplitude errors in the array coordinate system and 2) is not affected by propagation errors, mutual coupling variations in the array environment, or satellite rotation when a phased array is part of a satellite payload.

The method also provides for remotely calibrating a phased array antenna that can be implemented independently of existing array hardware with no required modifications.

The invention has now been explained with reference to specific embodiments. Other embodiments will be apparent to those of ordinary skill in the art in view of the foregoing description. It is not intended that this invention be limited except as indicated by the appended claims and their full scope equivalents.

What is claimed is:

1. A system for calibrating at least one element of a transmit array antenna, said array antenna coupled to a signal generating means for generating a coherent reference phase signal to said at least one element, the signal emerging from said signal generating means transmitted as a beam from said array antenna, said beam producing a null and a focused difference pattern having peaks on either side of the null, said array antenna forming a finite plane of said elements, the plane having a center point and extreme edges, said system comprising:
a null probe having a face, said null probe rigidly positioned normal to the plane of said array antenna and at a distance in the near-field of said array antenna,
said face of said null probe rigidly positioned over the center point of the plane thereby forming an angle between the center point and a point on one of the extreme edges of the plane of said array antenna,
said null probe therein positioned over the center point of said array antenna corresponding to said null,
said null probe, the center point, and the point on the extreme edge of the plane of said array antenna thereby forming a plane normal to the finite plane of said elements;
a reference probe including a face,
said reference probe rigidly positioned parallel to, and at an offset position away from, said null probe in the plane formed by said null probe, the center point and the point on the extreme edge of the plane of said array antenna,
said reference probe rigidly positioned at the distance in the near-field of said array antenna such that said face of said reference probe is positioned over one of the peaks of the focused difference pattern of the null;
said null probe receiving at the center point of said array antenna the null beam transmitted by said array antenna from said signal generating means to said at least one element, the beam received by said null probe coupled as a signal to a first attenuator,
said first attenuator coupled to a first two-way splitter,
said first two-way splitter receiving the signal from said null probe through said first attenuator;
said reference probe receiving at said offset position from said null probe the beam transmitted by said array antenna from said signal generating means, the beam received by said reference probe coupled as a signal to a second attenuator,
said second attenuator coupled to a second two-way splitter,
said second two-way splitter receiving the signal from said reference probe through said second attenuator;
a first mixer, said first mixer including as input ports a radio-frequency port and a local oscillator port, said first mixer including as an output port an intermediate frequency port;
a second mixer, said second mixer including as input ports a radio-frequency port and a local oscillator port, said second mixer including as an output port an intermediate frequency port;
said first two-way splitter splitting the signal received from said null probe through said first attenuator into a first signal, substantially 0 degree phase-shifted, which is coupled to said radio-frequency port of said second mixer, and into a second signal, substantially 90 degree phase-shifted, which is coupled to said radio-frequency port of said first mixer;
said second two-way splitter splitting the signal received from said reference probe through said second attenuator into a first signal, substantially 0 degree phase-shifted, which is coupled to said local oscillator port of said second mixer, and into a second signal, substantially 0 degree phase-shifted, which is coupled to said local oscillator port of said first mixer;
said first mixer combining the substantially 90 degree phase-shifted signal of said first two-way splitter and the substantially 0 degree phase-shifted signal of said second two-way splitter to yield an output signal at said intermediate-frequency port of said first mixer, said output signal at said intermediate-frequency port of said first mixer coupled to a first low-pass filter from which emerges a quadrature base-band component signal at substantially 0 degree frequency of the signal received from said null probe;
said second mixer combining the substantially 0 degree phase-shifted signal of said first two-way splitter and the substantially 0 degree phase-shifted signal of said second two-way splitter to yield an output signal at said intermediate-frequency port of said second mixer, said output signal at said intermediate-frequency port of said second mixer coupled to a second low-pass filter from which emerges an in-phase base-band component signal at substantially 0 degree frequency of the signal received from said null probe;
a processor,
said processor receiving as an input signal said quadrature base-band component signal at substantially 0 degree frequency of the signal received from said null probe and as an input signal said in-phase base-band component signal at substantially 0 degree frequency of the signal received from said null probe,
said processor processing said quadrature base-band component signal and said in-phase base-band component signal into data representing calibration reference values of said at least one element of said array antenna;
a recorder for recording said data representing calibration reference values of said at least one element of said array antenna, said recorder receiving said data from said processor; and
a beam steering controller for selecting the phases on said at least one element of said array antenna to form the difference null, and to vary the phase of said at least one element of said array antenna.

2. The system of claim 1 wherein said array antenna is a phased array antenna.

3. The system of claim 1 wherein said array antenna is an active array antenna.

4. The system of claim 1 further comprising at least one of a (a) printer and (b) display unit for illustrating said data representing calibration reference values of said at least one element of said array antenna.

5. A system for calibrating at least one element of a receive array antenna,
said array antenna forming a finite plane of said elements, the plane including a center point and extreme edges,
said system comprising:
a signal generating means for generating a coherent reference phase signal,
said coherent reference phase signal coupled to a zeroth two-way splitter,
said zeroth two-way splitter splitting said coherent reference signal into a null signal carried to a horn probe,
said horn probe including a face, said horn probe rigidly positioned normal to the plane of said array antenna and at a distance in the near-field of said array antenna, said face of said horn probe rigidly positioned over the center point of the plane thereby forming an angle between the center point and a point on one of the extreme edges of the plane of said array antenna, said horn probe therein positioned over the center point of said array antenna corresponding to said null, said horn probe, the center point, and the point on the extreme edge of the plane of said array antenna thereby forming a plane normal to the finite plane of said elements;

said horn probe transmitting at the center point of said array antenna the null beam received by said array antenna from said signal source to said at least one element, the null beam received by said array antenna coupled as a signal to a first attenuator, said first attenuator coupled to a first two-way splitter, said first two-way splitter receiving the signal from said array antenna through said first attenuator;

said zeroth two-way splitter splitting said coherent reference phase signal into a reference signal, said reference signal carried as a signal to a second attenuator, said second attenuator coupled to a second two-way splitter, said second two-way splitter receiving the signal from said zeroth two-way splitter through said second attenuator;

a first mixer, said first mixer including as input ports a radio-frequency port and a local oscillator port, said first mixer including as an output port an intermediate frequency port;

a second mixer, said second mixer including as input ports a radio-frequency port and a local oscillator port, said second mixer including as an output port an intermediate frequency port;

said first two-way splitter splitting the signal received from said null probe through said first attenuator into a first signal, substantially 0 degree phase-shifted, which is coupled to said radio-frequency port of said second mixer, and into a second signal, substantially 90 degree phase-shifted, which is coupled to said radio-frequency port of said first mixer;

said second two-way splitter splitting the signal received from said reference probe through said second attenuator into a first signal, substantially 0 degree phase-shifted, which is coupled to said local oscillator port of said second mixer, and into a second signal, substantially 0 degree phase-shifted, which is coupled to said local oscillator port of said first mixer;

said first mixer combining the substantially 90 degree phase-shifted signal of said first two-way splitter and the substantially 0 degree phase-shifted signal of said second two-way splitter to yield an output signal at said intermediate-frequency port of said first mixer, said output signal at said intermediate-frequency port of said first mixer coupled to a first low-pass filter from which emerges a quadrature base-band component signal at substantially 0 degree frequency of the signal received from said null probe;

said second mixer combining the substantially 0 degree phase-shifted signal of said first two-way splitter and the substantially 0 degree phase-shifted signal of said second two-way splitter to yield an output signal at said intermediate-frequency port of said second mixer, said output signal at said intermediate-frequency port of said second mixer coupled to a second low-pass filter from which emerges an in-phase base-band component signal at substantially 0 degree frequency of the signal received from said null probe;

a processor, said processor receiving as an input signal said quadrature base-band component signal at substantially 0 degree frequency of the signal received from said null probe and as an input signal said in-phase base-band component signal at substantially 0 degree frequency of the signal received from said null probe, said processor processing said quadrature base-band component signal and said in-phase base-band component signal into data representing calibration reference values of said at least one element of said array antenna;

a recorder for recording said data representing calibration reference values of said at least one element of said array antenna, said recorder receiving said data from said processor; and a beam steering controller for selecting the phases on said at least one element of said array antenna to form the difference null, and to vary the phase of said at least one element of said array antenna.

6. The system of claim 5 wherein said array antenna is a phased array antenna.

7. The system of claim 5 wherein said array antenna is an active array antenna.

8. The system of claim 5 further comprising at least one of a (a) printer and (b) display unit for illustrating said data representing calibration reference values of said at least one element of said array antenna.

9. A method of calibrating at least one element in one of a (a) transmit array antenna and (b) receive array antenna, said method comprising the steps of:

forming a difference null with errors for said at least one element being calibrated in phase state n, thereby yielding the in-phase base-band component, $I_n$, and the quadrature base-band component, $Q_n$ of said difference null;

estimating the difference null without the element being calibrated by averaging over N phase states, by solving for $$\epsilon = 1/N \Sigma (I + jQ_n);$$

estimating the field of the element in phase state n by subtracting the null without the element from the null with the element;

calculating field, $E_n$, of the element in phase state n by solving:

$$E_n = (I_n + jQ_n) - \epsilon = x_n + jy_n;$$

computing the absolute value of the estimate of the field of the element in phase state n, $|E_n|$, and the phase of the estimate of the field of the element in phase state n, $\arctan(y_n/x_n)$; and processing results of the calibration of the element being calibrated upon determining that all desired array elements have been measured.

10. The method of claim 9 wherein said array antenna is a phased array antenna.

11. The method of claim 9 wherein said array antenna is an active array antenna.

12. The method of claim 9 further comprising the steps of at least one of a (a) printing and (b) displaying said data representing calibration reference values of said at least one element of said array antenna.

* * * * *